United States Patent
Wu et al.

(10) Patent No.: US 9,651,578 B2
(45) Date of Patent: May 16, 2017

(54) ASSEMBLY METHOD OF DIRECT-DOCKING PROBING DEVICE

(71) Applicant: MPI Corporation, Zhubei (TW)

(72) Inventors: Chien-Chou Wu, Chu-Pei (TW);
Ming-Chi Chen, Chu-Pei (TW);
Tsung-Yi Chen, Chu-Pei (TW);
Chung-Che Li, Chu-Pei (TW)

(73) Assignee: MPI CORPORATION, Zhubei (TW)

( * ) Notice: Subject to any disclaimer, the term of this patent is extended or adjusted under 35 U.S.C. 154(b) by 261 days.

(21) Appl. No.: 14/515,537

(22) Filed: Oct. 16, 2014

(65) Prior Publication Data

US 2015/0033553 A1    Feb. 5, 2015

Related U.S. Application Data

(63) Continuation-in-part of application No. 13/091,148, filed on Apr. 21, 2011, now abandoned.

(51) Int. Cl.
*G01R 3/00* (2006.01)
*G01R 31/28* (2006.01)
*B23K 103/00* (2006.01)

(52) U.S. Cl.
CPC ......... *G01R 3/00* (2013.01); *G01R 31/2853* (2013.01); *G01R 31/2887* (2013.01);
(Continued)

(58) Field of Classification Search
CPC .. G01R 3/00; G01R 31/2887; G01R 31/2889; G01R 31/2853; B23K 2203/42;
(Continued)

(56) References Cited

U.S. PATENT DOCUMENTS 5,366,380 A   11/1994   Reymond
5,850,148 A   12/1998   Nam
(Continued)

FOREIGN PATENT DOCUMENTS

CN   1808130 A    7/2006
CN   201302583 Y  9/2009
(Continued)

OTHER PUBLICATIONS

Huang et al., CN 101644724 A (including English Translation), Feb. 2010.*

*Primary Examiner* — A. Dexter Tugbang
(74) *Attorney, Agent, or Firm* — Ding Yu Tan

(57) ABSTRACT

An assembly method of direct-docking probing device is provided. First, a space transforming plate made by back-end-of-line semiconductor manufacturing process is provided, so the thickness of the space transforming plate is predetermined by the client of probe card manufacturer. Then a reinforcing plate in which a plurality of circuits disposed is provided, which has larger mechanical strength than the space transforming plate. After that the reinforcing plate and the space transforming plate are joined and electrically connected by a plurality of solders so as to form a space transformer. Then, a conductive elastic member and a probe interface board are provided. Thereafter, the space transformer and the conductive elastic member are mounted on the probe interface board. After that, at least one vertical probe assembly having a plurality of vertical probes is mounted on the space transforming plate, and the vertical probes is electrically connected with the space transforming plate.

13 Claims, 19 Drawing Sheets

(52) U.S. Cl.
CPC ...... *G01R 31/2889* (2013.01); *B23K 2203/42* (2015.10); *Y10T 29/49004* (2015.01); *Y10T 29/49128* (2015.01); *Y10T 29/49155* (2015.01); *Y10T 29/49204* (2015.01); *Y10T 29/49208* (2015.01); *Y10T 29/49222* (2015.01)

(58) Field of Classification Search
CPC ......... Y10T 29/49004; Y10T 29/49128; Y10T 29/49155; Y10T 29/49204; Y10T 29/49208; Y10T 29/49222
See application file for complete search history.

(56) References Cited

U.S. PATENT DOCUMENTS

| | | | |
|---|---|---|---|
| 7,535,239 B1 | 5/2009 | Dang et al. | |
| 2004/0124507 A1* | 7/2004 | Aldaz | G01R 3/00 257/668 |
| 2004/0124519 A1* | 7/2004 | Zhou | G01R 3/00 257/686 |
| 2008/0044637 A1* | 2/2008 | Masuda | B23K 2203/42 428/220 |
| 2010/0330830 A1 | 12/2010 | Chui | |

FOREIGN PATENT DOCUMENTS

| | | | |
|---|---|---|---|
| JP | 2005064313 A | * | 3/2005 |
| TW | 200916786 A | | 4/2009 |
| TW | 200944801 A | | 11/2009 |
| TW | 201000912 A | | 1/2010 |
| TW | 201003078 A | | 1/2010 |
| TW | M392351 U1 | | 11/2010 |

* cited by examiner

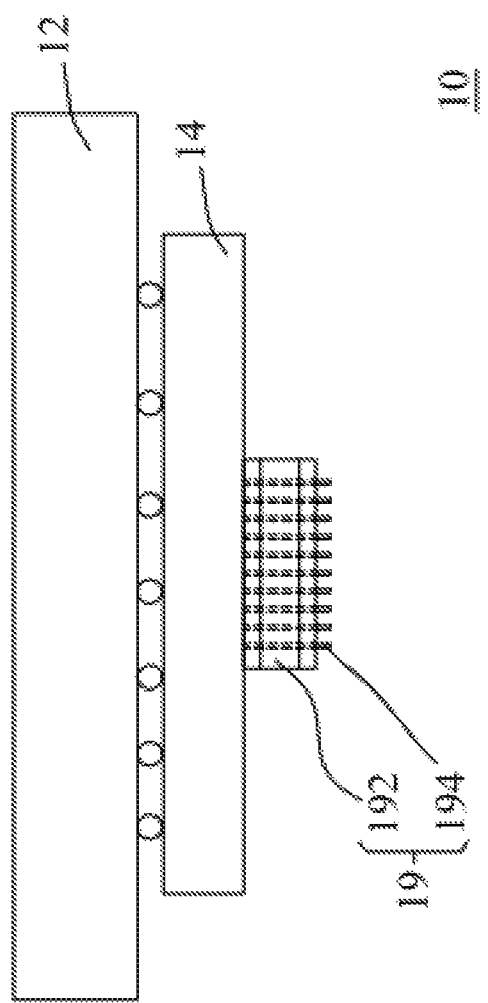
FIG 2 --Prior Art--

_US 9,651,578 B2_

ASSEMBLY METHOD OF DIRECT-DOCKING PROBING DEVICE

CROSS-REFERENCE TO RELATED APPLICATION

This application is a non-provisional continuation-in-part application claiming priority of U.S. non-provisional application Ser. No. 13/091,148, filed on Apr. 21, 2011, which is currently pending. The entirety of the above-mentioned patent application is hereby incorporated by reference herein and made a part of this specification.

FIELD OF INVENTION

The invention relates to a probing device, especially relates to a probing device having a longer service life and a space transforming plate thereof to be less likely to be deformed.

BACKGROUND OF THE INVENTION

Please refer to FIG. 1A and FIG. 1B. FIG. 1A shows a conventional probing system. FIG. 1B shows a probing device shown in FIG. 1A. The probing system 1000 includes a test head 1100, a conventional probing device 1200, and a prober 1400. The probing device 1200 includes a probe interface board 1210, a pogo tower 1220, and a probe card 1230. The probing device 1200 is mounted on the test head 1100. The test signals sent from the test head 1100 are passed through the probe interface board 1210, the pogo tower 1220, and the probe card 1230 in turn, and then transmitted into a device under test (DUT) 1300 via a plurality of vertical probes 1231 of the probe card 1230. Because the signal transmission path is of a relatively long distance, signal failure is possible to occur when a plurality of high-frequency test signals are transmitted.

To try to overcome the above described problems, person skilled in the art had provided another probing system and device. Please refer to FIG. 2 which shows another conventional probing system. A conventional probing device 10 includes a probe interface board 12, a space transforming plate 14, and a vertical probe assembly 19. The probe interface board 12 is electrically connected with the space transforming plate 14 via a plurality of solders. The vertical probe assembly 19 includes a guide plate 192 and a plurality of vertical probes 194. The guide plate 192 is mounted on the bottom surface of the space transforming plate 14. The vertical probes 194 are penetrated through the guide plate 192 and electrically connected with the space transforming plate 14.

The probing device 10 is a direct-docking probing device. No probe card is disposed in the probing device 10, so that the signal transmission path is shorter and the probing device 10 is suitable for carrying the high-frequency signals. In the probing device 10 (of direct-docking type), the probe interface board 12 is used to replace the circuit board of the probe card. Because the area of the probe interface board 12 is several times larger than that of the circuit board of the probe card, more electronic components can be mounted on the probe interface board 12. Therefore, the probe interface board 12 has improved test effectiveness and can detect more types of DUTs. In addition, due to having a larger area, the probe interface board 12 can be configured to test a larger number of DUTs at the same time.

Whether referring to the probing device 10 in FIG. 2 or the probing device 1200 in FIG. 1B, both probing devices 10, 1200, each of which requires to use a seating surface for a flatness standard. The flatness is defined as the difference between the maximum and minimum distances from the tip of the probe to the seating surface.

However, the probe interface board 12 and the space transforming plate 14 are connected together by reflowing. During the reflowing operation, the probe interface board 12 must sustain high temperature heating, so that the probe interface board 12 is possible to become damaged. In addition, the unit cost of the probe interface board 12 is higher due to having more electronic components disposed thereon, and the cost burden on the user is thereby increased.

In order to try to solve the above described problems, another conventional probing device 20 shown in FIG. 3 is provided. The probing device 20 includes a probe interface board 22, a space transforming plate 24, a fixing frame 25, a supporting plate 26, a plurality of electrical contacts 28, and a vertical probe assembly 29. The supporting plate 26 is disposed between the probe interface board 22 and the space transforming plate 24. The electrical contacts 28 are disposed in the supporting plate 26. The fixing frame 25 is mounted on the probe interface board 22. The holding portion 251 of the fixing frame 25 is holding on the space transforming plate 24, in order to ensure adequate electrical conductivity between the electrical contacts 28 and the space transforming plate 24. The electrical contacts 28 and the probe interface board 22 are connected without the reflowing operation, so that the probe interface board 22 does not require sustaining higher temperature heating, and thus the probe interface board 22 has longer service life.

In today's industry, the space transforming plate 24 is made by the back-end-of-line (BEOL) semiconductor manufacturing process, i.e. packaging process, so that the thickness of the space transforming plate 24 has become thinner. However, the height from the bottom surface of the probe interface board 22 to the tip of the vertical probe assembly 29 is limited by the usage environment; thus, such height is harder to be adjusted when the space transforming plate 24 becomes thinner. Taiwan patent publication number 201003078 discloses a thickening plate. The thickening plate, disposed between the electrical contacts and the space transforming plate, can solve the problems caused by the thinner space transforming plate. However, the thickening plate is mainly used in the vertical probe card instead of the direct-docking probing system.

Furthermore, the area of the space transforming plate 24 becomes larger due to the corresponding larger area of the probe interface board 22. Because of the thinner thickness and the larger area of the space transforming plate 24, the space transforming plate 24 will have larger deformation when the electrical contacts 28 apply an elastic force on it. Therefore, the probes of the vertical probe assembly 29 cannot accurately be contacted with the device under test. In addition, when the vertical probe assembly 29 is contacted with the device under test, the device under test will apply a reaction force back to the vertical probe assembly 29, so as to deflect the space transforming plate 24 toward the probe interface board 22, thus compressing and damaging the electrical contacts 28.

Hence, there is a need in the art for preventing the space transforming plate from being deflected in the direct-docking probing device.

SUMMARY OF THE INVENTION

One aspect of the invention is to provide an assembly method of direct-docking probing device. The direct-docking probing device made from the assembly method can prevent the space transforming plate from being deflected.

To achieve the foregoing and other aspects, an assembly method of direct-docking probing device is provided. First, a space transforming plate is provided. The space transforming plate is made by a back-end-of-line semiconductor manufacturing process. Then a reinforcing plate in which a plurality of circuits disposed thereon is provided. And the reinforcing plate has greater mechanical strength than that of the space transforming plate. After that, the reinforcing plate and the space transforming plate are joined and electrically connected by a plurality of solders so as to form a space transformer. In next step, a conductive elastic member is provided. Then, a probe interface board is provided. The conductive elastic member is located between and electrically connected with the probe interface board and the reinforcing plate, and the probe interface board is mounted on a test head. After that, at least one vertical probe assembly having a plurality of vertical probes is provided. Then, the vertical probe assembly is mounted on the space transforming plate, and the vertical probes are electrically connected with the space transforming plate. In addition, the thickness of the space transforming plate is smaller than 1.8 mm and the thickness of the reinforcing plate is larger than 1.0 mm. And the thickness of space transforming plate is predetermined or configured by the client of the probe card manufacturer instead.

In the assembly method of the probing device, a fixing frame is further provided. The fixing frame includes a stiffener, a frame body, and a holding portion. After that, the space transformer and the conductive elastic member are put in the frame body, and the holding portion hold on the space transformer. Then, the fixing frame containing the space transformer and the conductive elastic member are mounted on the probe interface board. Furthermore, in the assembly method of the probing device, the stiffener is disposed on the probe interface board.

In the assembly method of the probing device, the holding portion is holding on the reinforcing plate.

In the assembly method of the probing device, the holding portion is holding on the space transforming plate.

In the assembly method of the probing device, the reinforcing plate is a multilayer ceramic structure, and the space transforming plate is a multilayer organic structure. The thickness of the space transforming plate is between 1.0 mm and 3.0 mm.

In the assembly method of the probing device, the conductive elastic member comprises a supporting plate and a plurality of electrical contacts. The electrical contacts are penetrated through and fixed by the supporting plate; and the electrical contacts possess elasticity.

In the assembly method of the probing device, the electrical circuits in the reinforcing plate are vertically penetrated through the reinforcing plate.

In the assembly method of the probing device, the frame body and the holding portion are formed integrally.

In the assembly method of the probing device, the quantity of the space transforming plates and the vertical probe assemblies are both numerous, i.e. more than one. Each vertical probe assembly is individually electrically connected to one of the space transforming plates, respectively.

In the assembly method of the probing device, the reinforcing plate and the space transforming plate are rectangular. And the length of the reinforcing plate is 5 mm to 10 mm longer than the length of the space transforming plate.

Because the mechanical strength of the reinforcing plate is larger than that of the space transforming plate, the amount of deformation of the reinforcing plate is smaller than that of the space transforming plate. Therefore, the offset amount of the vertical probe assembly is small, so that the vertical probes can be more accurately contacted with the device under test.

BRIEF DESCRIPTION OF THE DRAWINGS

FIG. 2 shows another conventional probing system.

DETAILED DESCRIPTION OF THE INVENTION

Figure 4A:
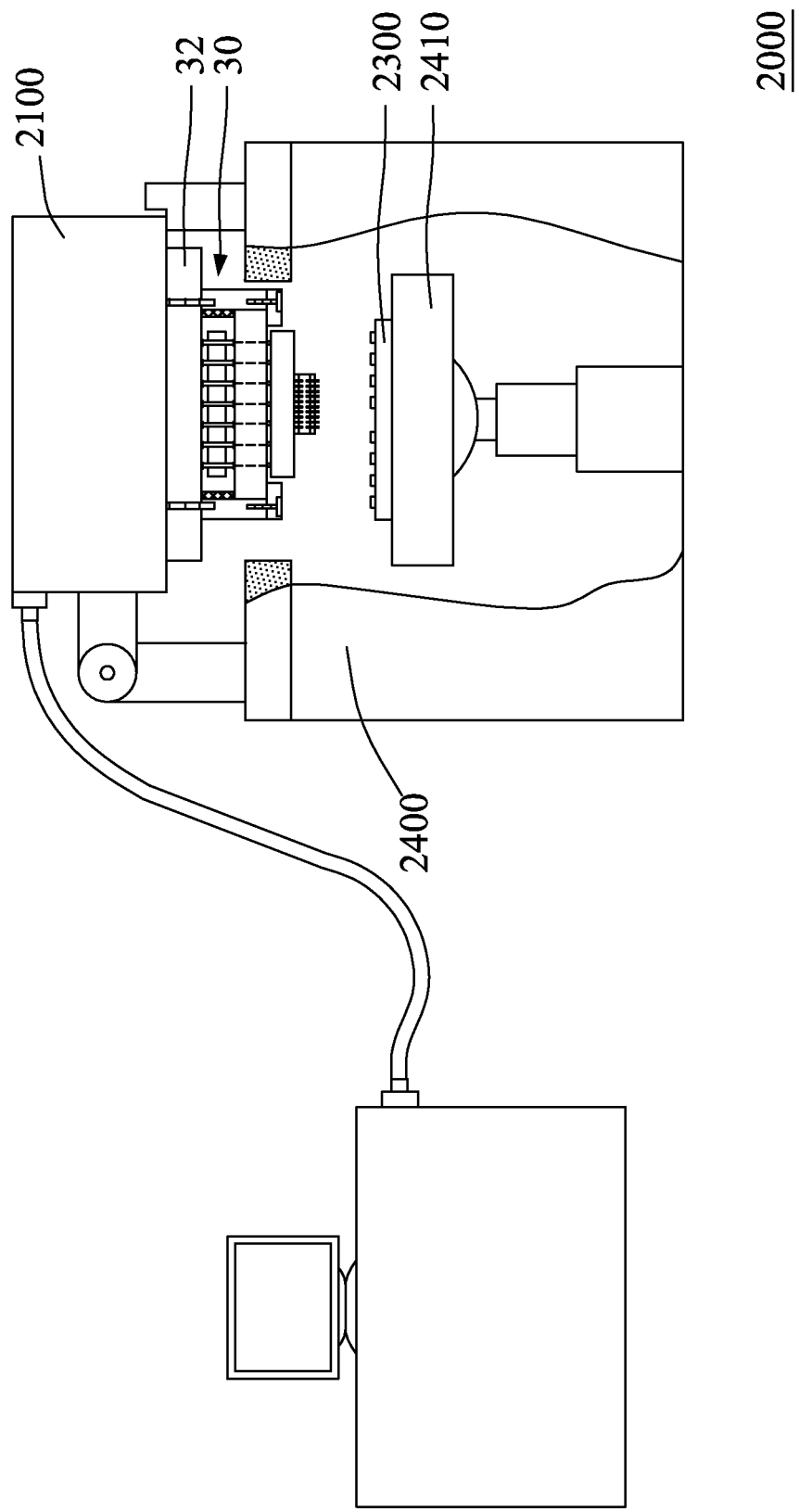
FIG. 4A shows a probing system of a first embodiment in the present invention.
Figure 4B:
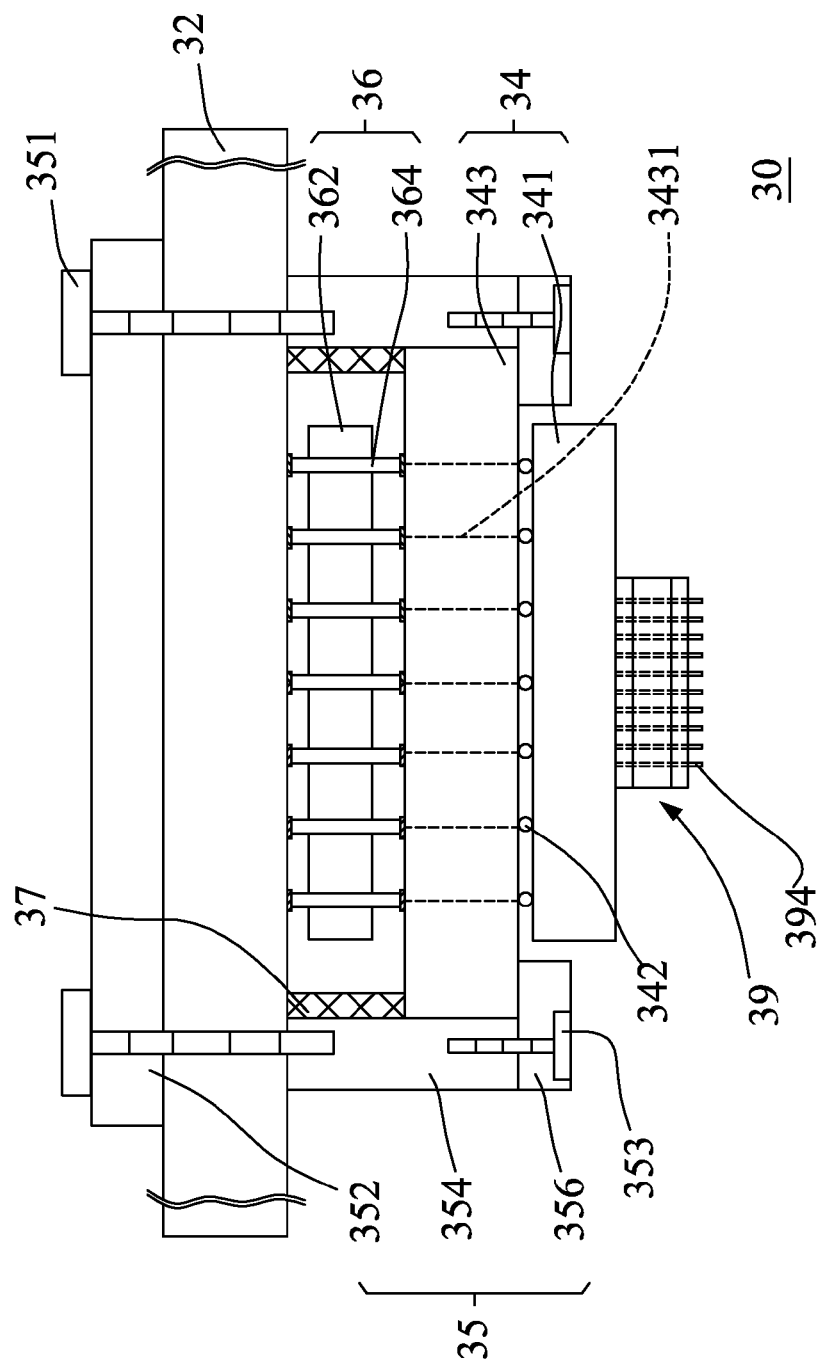
FIG. 4B shows a probing device of the first embodiment in the present invention.

Please refer to FIG. 4A and FIG. 4B. FIG. 4A shows a probing system of a first embodiment in the present invention. FIG. 4B shows a probing device 30 of the first embodiment in the present invention. The probing device 30 is, for example, mounted on the probing system 2000. The probing system 2000 includes a test head 2100, the probing device 30, and a prober 2400. The prober 2400 includes a wafer stage 2410. A device under test 2300 is disposed on the wafer stage 2410. The probing device 30 includes a probe interface board 32, a space transformer 34, a fixing frame 35, a conductive elastic member 36, two protective spacers 37, and a vertical probe assembly 39.

Figure 1A:
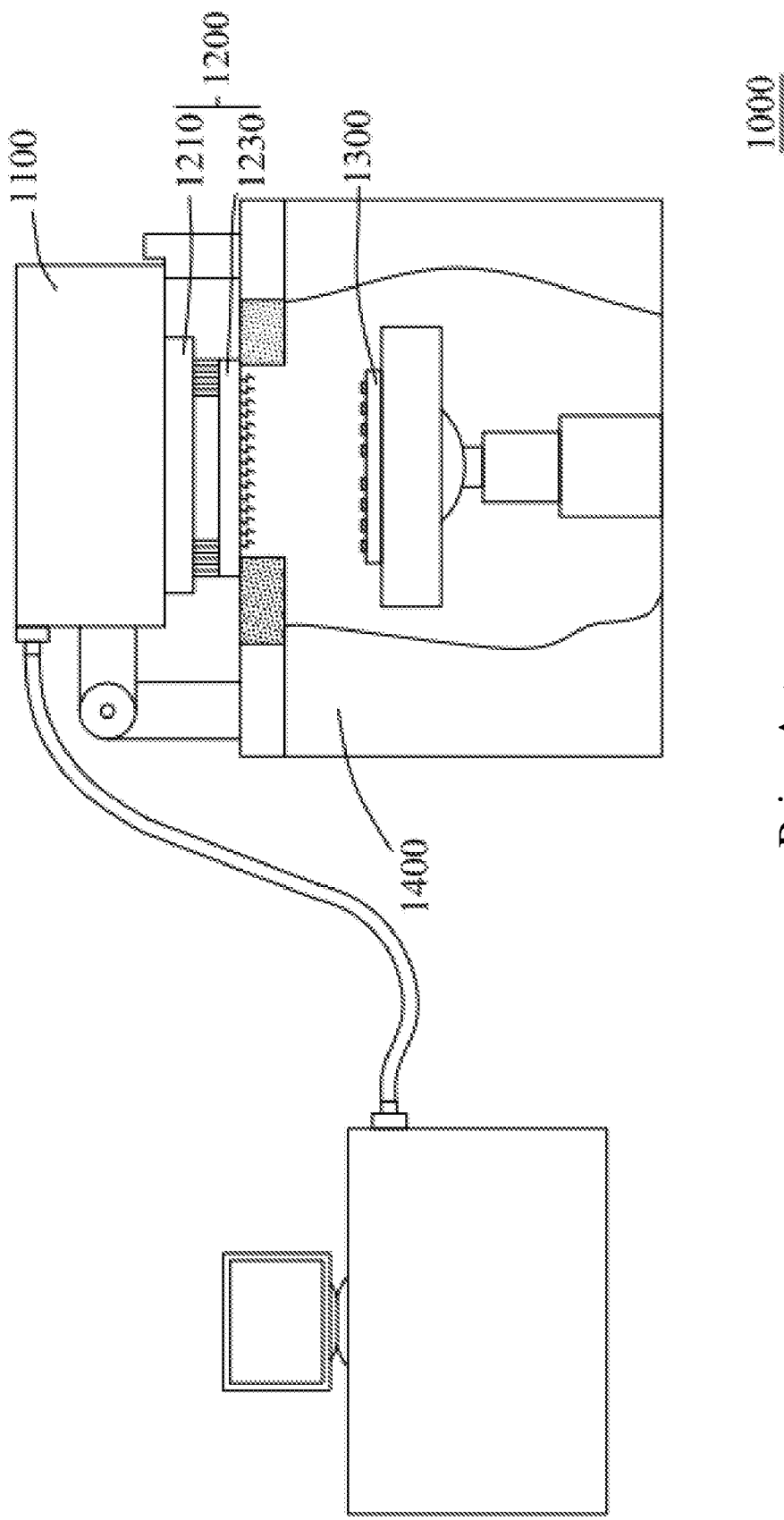
FIG. 1A shows a conventional probing system.

Please refer to FIG. 1A and FIG. 4A. In FIG. 1A the probe card 1230 of the probing device 1200 is configured to be set downward. The seating surface for the probe card 1230 is formed on the prober 1400. In FIG. 4A, the probing device 30 is connected with the test head 2100. In other words, the probe interface board 32 of the probing device 30 is set in an upward configuration. The seating surface for the probe interface board 32 is formed on the test head 2100, i.e. the probe interface board 32 is mounted on and connected with the test head 2100.

Please refer to FIG. 4B. The space transformer 34 includes a space transforming plate 341 and a reinforcing plate 343. The reinforcing plate 343 is located between the probe interface board 32 and the space transforming plate 341. In this embodiment, the reinforcing plate and the space transforming plate are rectangular, and the length of the reinforcing plate 343 is for example 5 mm~10 mm longer than the length of the space transforming plate 341. The reinforcing plate 343 is electrically connected with the space transforming plate 341 via a plurality of solders 342. Furthermore, the mechanical strength of the reinforcing plate 343 is larger than that of the space transforming plate 341. Because of the presence and usage of the reinforcing plate 343 in the space transformer 34, the overall mechanical strength of the space transformer 34 is increased.

The conductive elastic member 36 is located between the reinforcing plate 343 and the probe interface board 32. In the embodiment, the conductive elastic member 36 includes a supporting plate 362 and a plurality of electrical contacts 364. The electrical contacts 364 possess elasticity, and are penetrated through and supported by the supporting plate 362. Furthermore, a plurality of circuits 3431 is disposed in the reinforcing plate 343. Therefore, after passing through the electrical contacts 364, the test signals sent from the probe interface board 32 is then passed through the circuits 3431 in the reinforcing plate 343 and transferred into the space transforming plate 341.

The fixing frame 35 includes a stiffener 352, a frame body 354, and a holding portion 356. The stiffener 352 is disposed on one side of the probe interface board 32, and by using two locking screws 351 the frame body 354 can be screwed on the other side of the probe interface board 32. The frame body 354 contains the reinforcing plate 343 and the conductive elastic member 36. The holding portion 356 is locked on the frame body 354 by the two locking screws 353. The holding portion 356 is holding on one side of the reinforcing plate 343, in order to ensure adequate electrical conductivity between the electrical contacts 364 and the space transforming plate 343. Although the frame body 354 and the holding portion 356 are of two different elements, the frame body 354 and the holding portion 356 can be formed integrally, so that the locking screws 353 are no longer needed. In addition, the electrical conductivity between the electrical contacts 364 and the reinforcing plate 343 can be enhanced by screwing the locking screws 351 more tightly.

Figure 4C:
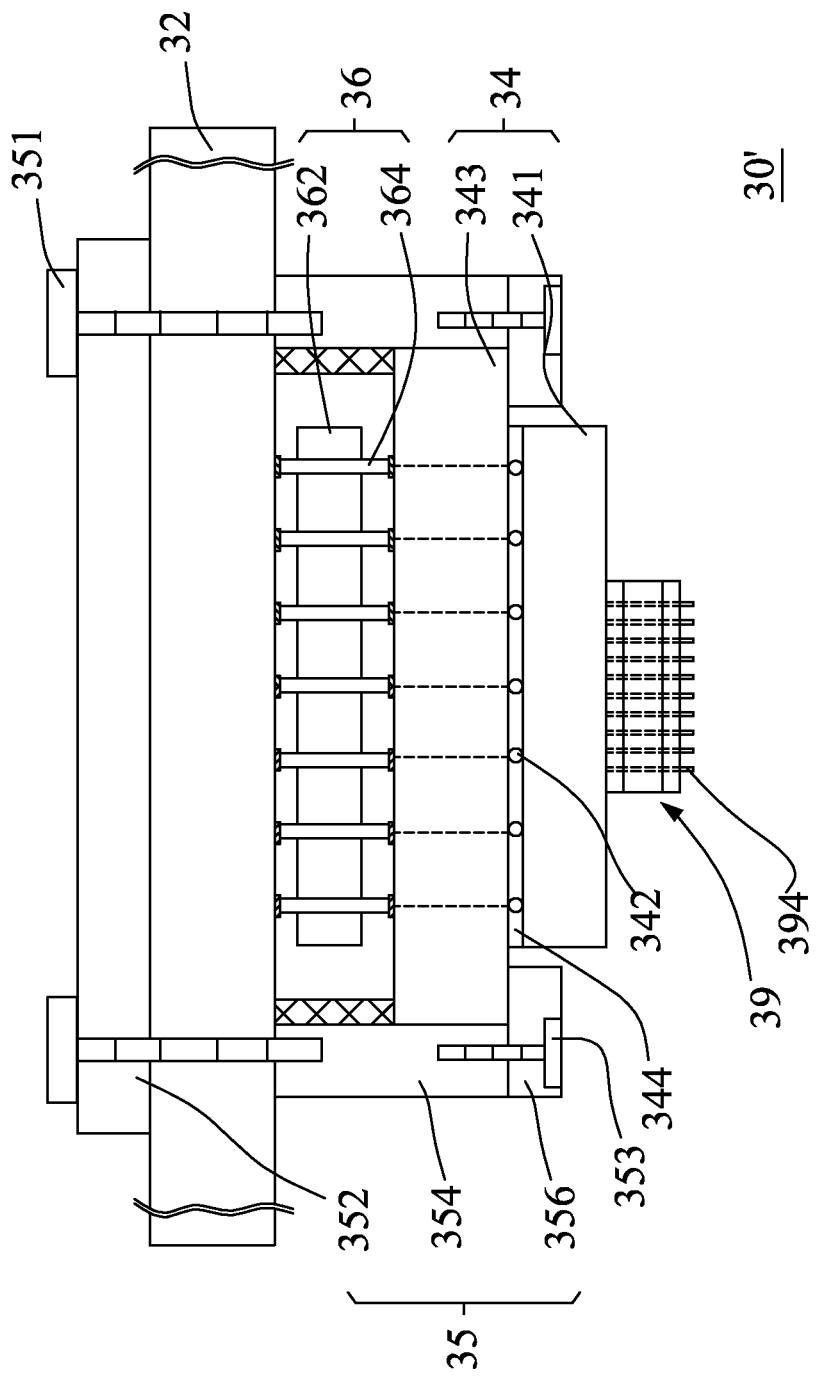
FIG. 4C shows a probing device of a second embodiment in the present invention.
Figure 4D:
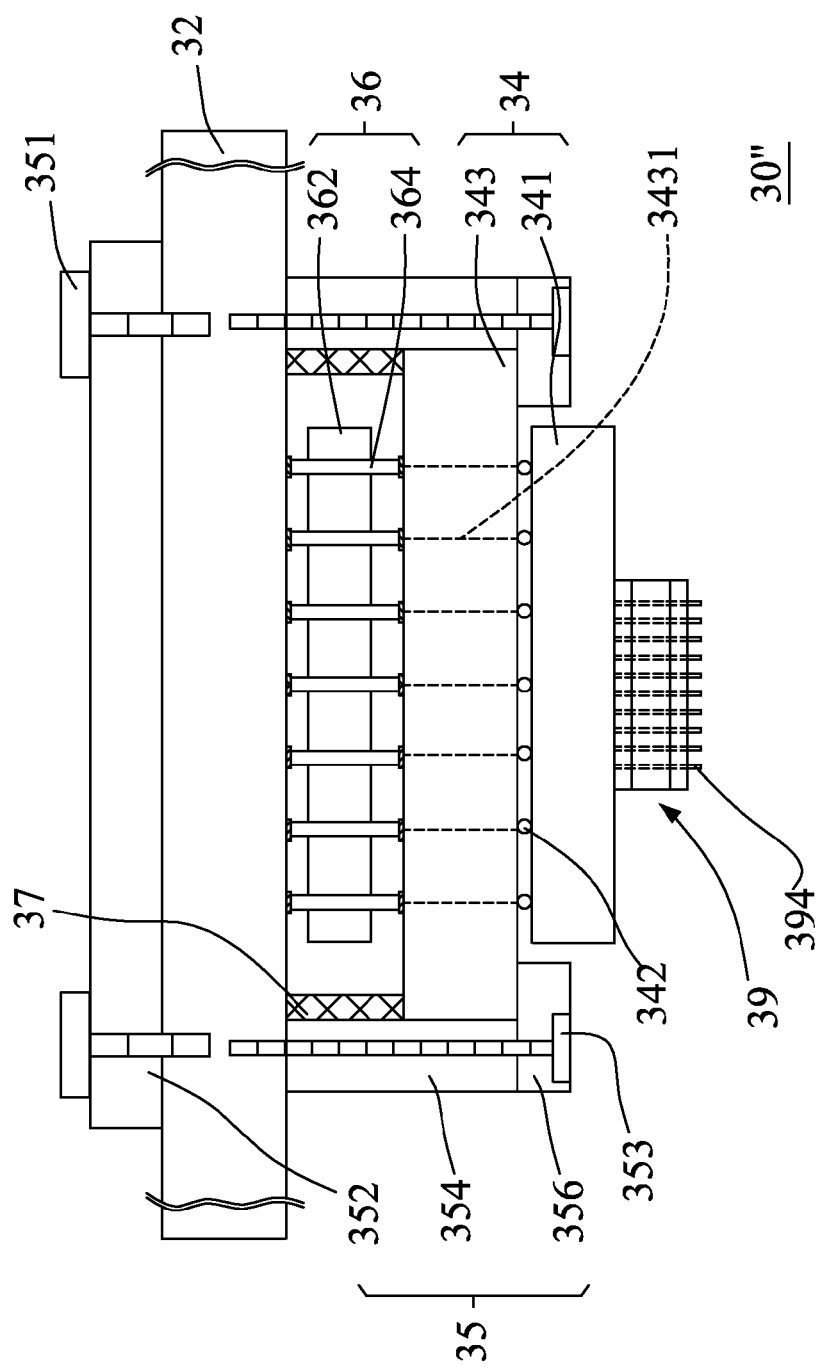
FIG. 4D shows a probing device of variant embodiment compared to FIG. 4C in the present invention.

In addition, please refer to the probing device 30" shown in FIG. 4D, the locking screws 353 are penetrated through the frame body 354 and screwed into the probe interface board 32, and the locking screws 351 are penetrated through the stiffener 352 and screwed into the probe interface board 32. In other words, the frame body 354 is mounted on the probe interface board 32 by using the locking screws 353.

Furthermore, the protective spacer 37 is disposed between the reinforcing plate 343 and the probe interface board 32, and located around the periphery of the conductive elastic member 36. The two protective spacers 37 are each located on the two opposite sides, respectively. The top ends of the protective spacers 37 are pressed against the probe interface board 32 and the bottom ends of the protective spacers 37 are pressed on the reinforcing plate 343. Compared with respect to the holding portion 356, the protective spacers 37 are pressed on the other side of the reinforcing plate 343. However, in other embodiment, person having ordinary skill in the art can choose not to dispose the protective spacers 37 in the probing device 30.

Please refer to FIG. 4A. The vertical probe assembly 39 includes a plurality of vertical probes 394. The vertical probes 394 are electrically connected with the space transforming plate 341. The bottom of the vertical probes 394 are contacted with the device under test (not shown).

Figure 3:
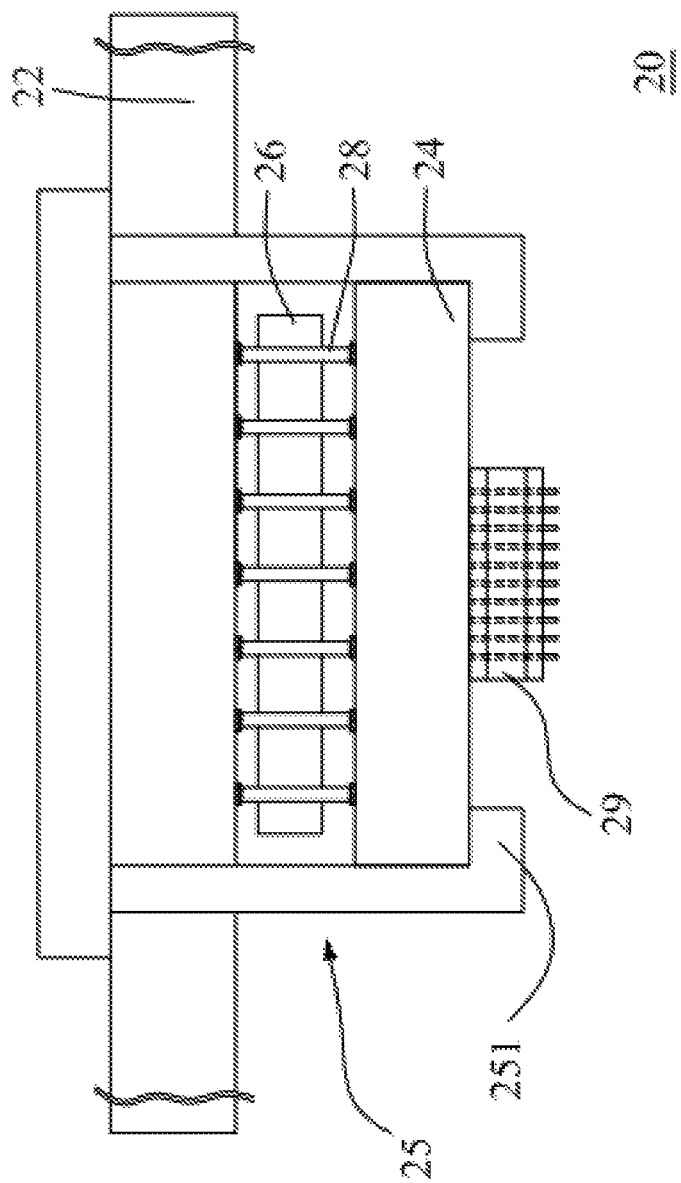
FIG. 3 shows yet another conventional probing system.

In the embodiment, the Young's module of the space transforming plate 341 is 11 Gpa, and the Young's module of the reinforcing plate 343 is 120 Gpa. Because the mechanical strength of the reinforcing plate 343 is larger than that of the space transforming plate 341, the amount of deformation of the space transforming plate 341 is smaller than that of the space transforming plate 24 in FIG. 3. Therefore, compared to the vertical probe assembly 29 in FIG. 3, the offset amount of the vertical probe assembly 39 is smaller, so that the vertical probes 394 can be more accurately contacted with the device under test (not shown).

In addition, when the vertical probe 394 is contacted with the device under test, the device under test will apply a reaction force back to the vertical probe 394. At the same time, because of the support of the protective spacer 37, the space transformer 34 is not easily deflected toward the probe interface board 32. Thus, the electrical contacts 364 are not easily compressed and are thereby better protected.

In the embodiment, the reinforcing plate 343 is a multilayer ceramic structure, and the space transforming plate 341 is a multilayer organic structure. Person of ordinary skill in the art can modify the material and the structure of the reinforcing plate 343 or the space transforming plate 341, provided that the mechanical strength of the reinforcing plate 343 is larger than that of the space transforming plate 341, so as to prevent any large amount of deformation from occurring on the space transforming plate 341. The reinforcing plate 343 can also be made as a multilayer organic structure, a printed circuit board structure, or a FR-4 type glass fiber board.

In this embodiment, the thickness of the space transforming plate 341 is smaller than 1.8 mm and predetermined or configured by the client of the probe card manufacturer instead. The thickness of the reinforcing plate 343 is larger than 1.0 mm, in the preferred embodiment the thickness of the reinforcing plate 343 is between 1.0 mm and 3.0 mm. In a preferred embodiment, the thickness of the space transforming plate 341 is smaller than 1.8 mm.

Please refer to FIG. 4C which shows a probing device 30' of a second embodiment in the present invention. In the probing device 30', the solders 342 are surrounded by a filler layer 344, and the filler layer 344 is made of polymer material. The filler layer 344 is used to prevent the solders 342 from being polluted by the external environment. Because the other elements of the probing device 30' is identical or similar to the elements shown in FIG. 4B, they are marked with the same numbers in FIG. 4C and not described in detail.

Person of ordinary skill in the art can use other protective device to replace the protective spacer 37, for example: a protective frame. The protective frame is a hollow plate-shaped object and is located around the conductive elastic member 36. The hollow portion of the protective frame is used to contain the conductive elastic member 36. The two ends of the protective frame are pressed on the probe interface board 32 and the reinforcing plate 343, respectively.

Figure 5A:
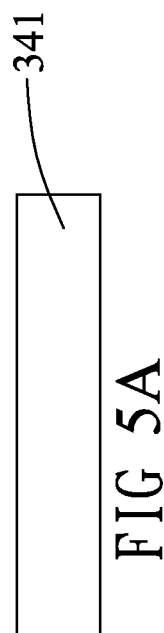
FIG. 5A~FIG. 5E show the assembly method of the probing device in FIG. 4B.

In the following, the assembly method of the probing device 30 is described. Please refer to FIG. 5A, the space transforming plate 341 is provided. The space transforming plate 341 is made by a back-end-of-line semiconductor manufacturing process, i.e. packaging process. In other words, the space transforming plate 341 is provided and predetermined by the client or customer of the manufacturer of the probing device 30. Therefore, the manufacturer of the probing device 30 cannot change or alter the size, for example: length and height, of the space transforming plate 341.

Figure 5B:
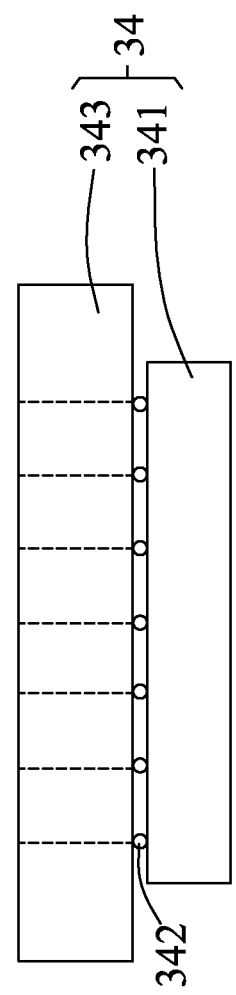

Then, as shown in FIG. 5B, the reinforcing plate 343 is provided, the reinforcing plate 343 has greater mechanical strength than that of the space transforming plate 341. Furthermore, the reinforcing plate 343 and the space transforming plate 341 are joined and electrically connected by reflowing method, i.e. reflowing the solders 342, so as to form the space transformer 34.

Figure 5C:
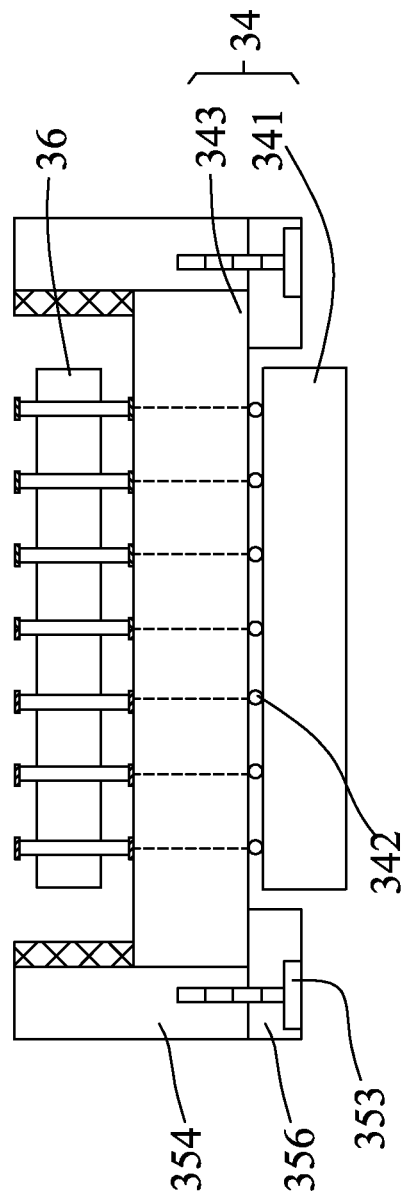
Figure 5D:
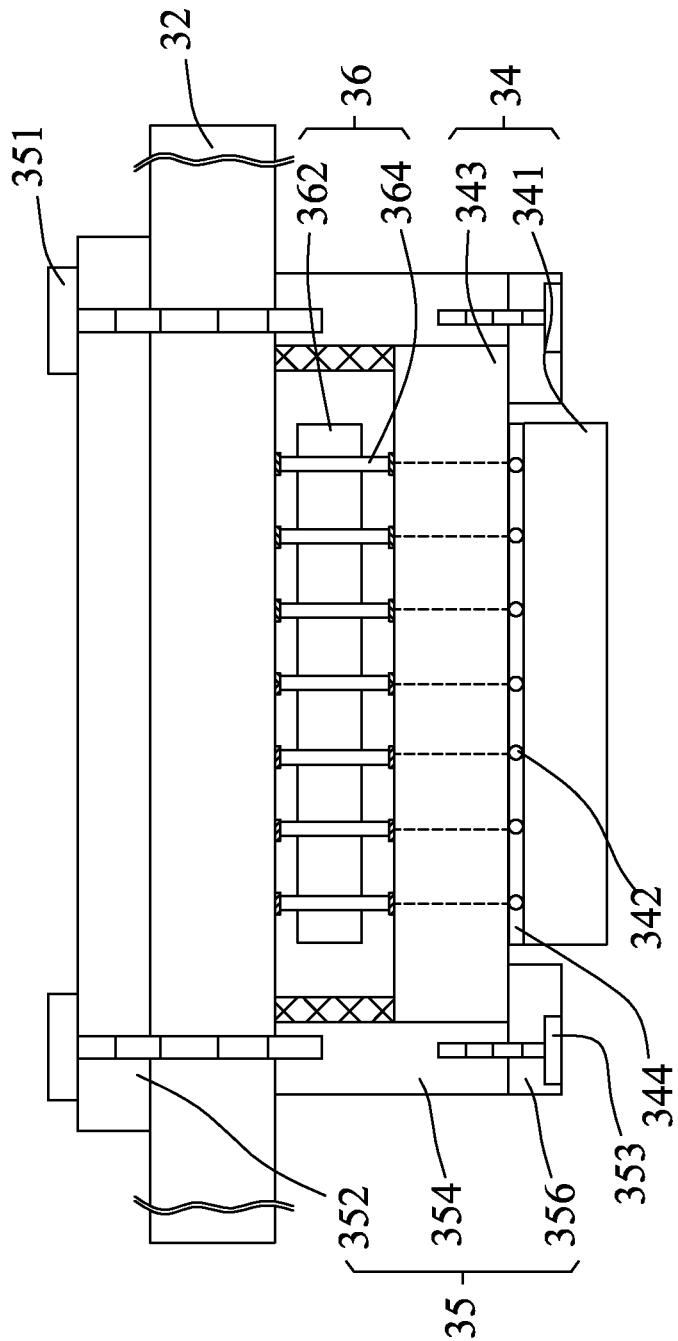
Figure 5E:
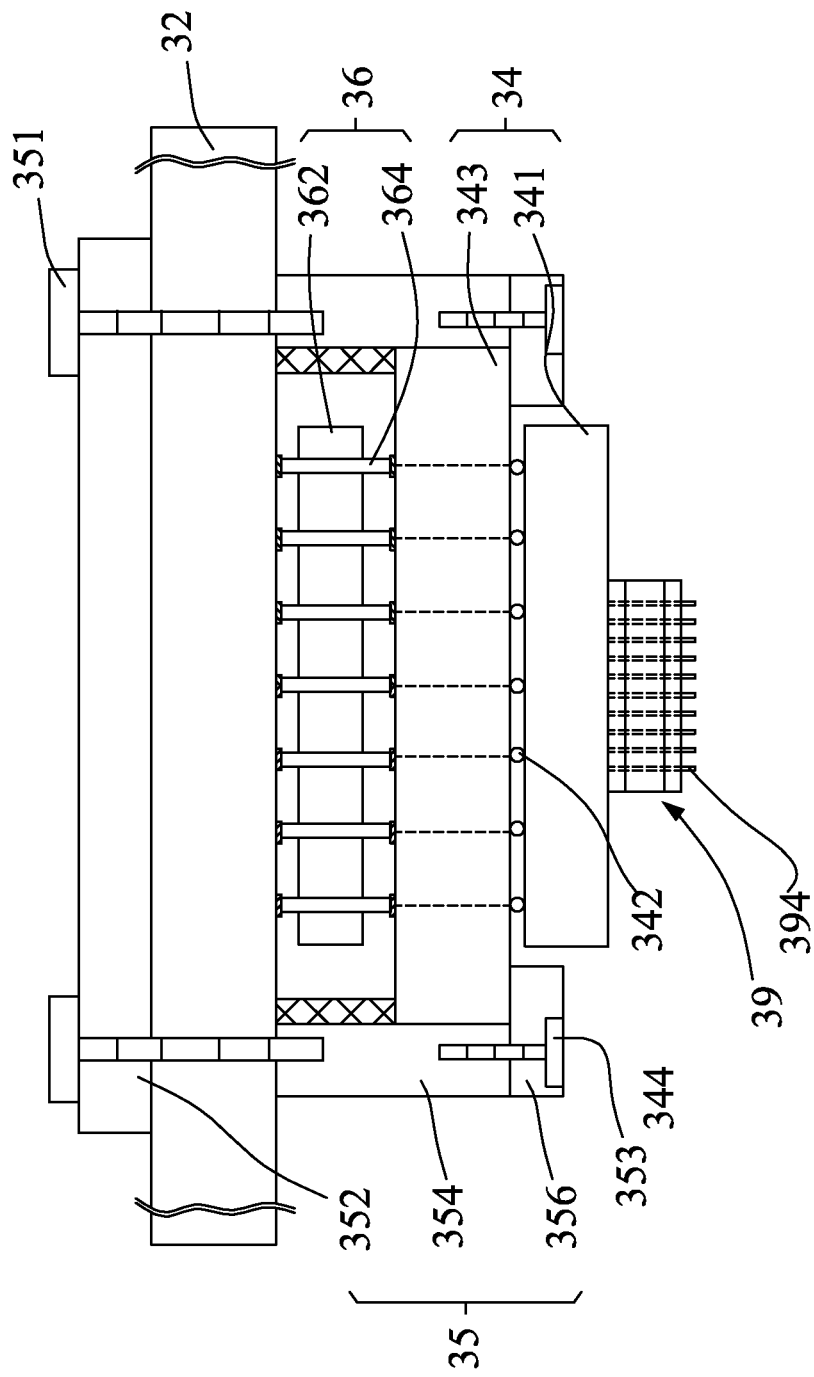

Thereafter, as shown in FIG. 5C, the conductive elastic member 36 and the frame body 354 are provided. After that, the space transformer 34, the conductive elastic member 36, and the protective spacer 37 are put in the frame body 354, and then the locking screws 353 are screwed so as to press the holding portion 356 on the space transformer 34. In the embodiment, the holding portion 356 is holding on the reinforcing plate 343, but the holding portion 356 can also be holding on the space transforming plate 341. After that, as shown in FIG. 5D, the probe interface board 32 is provided, and the frame body 354 is mounted on the probe interface board 32 by using the stiffener 352 and the locking screws 351. Or, the frame body 354 can be mounted on the probe interface board 32 by using the locking screws 353 as shown in FIG. 4D. In next step, as shown in FIG. 5E, the vertical probe assembly 39 having a plurality of vertical probes 394 is provided and mounted on the space transforming plate 341.

Figure 6:
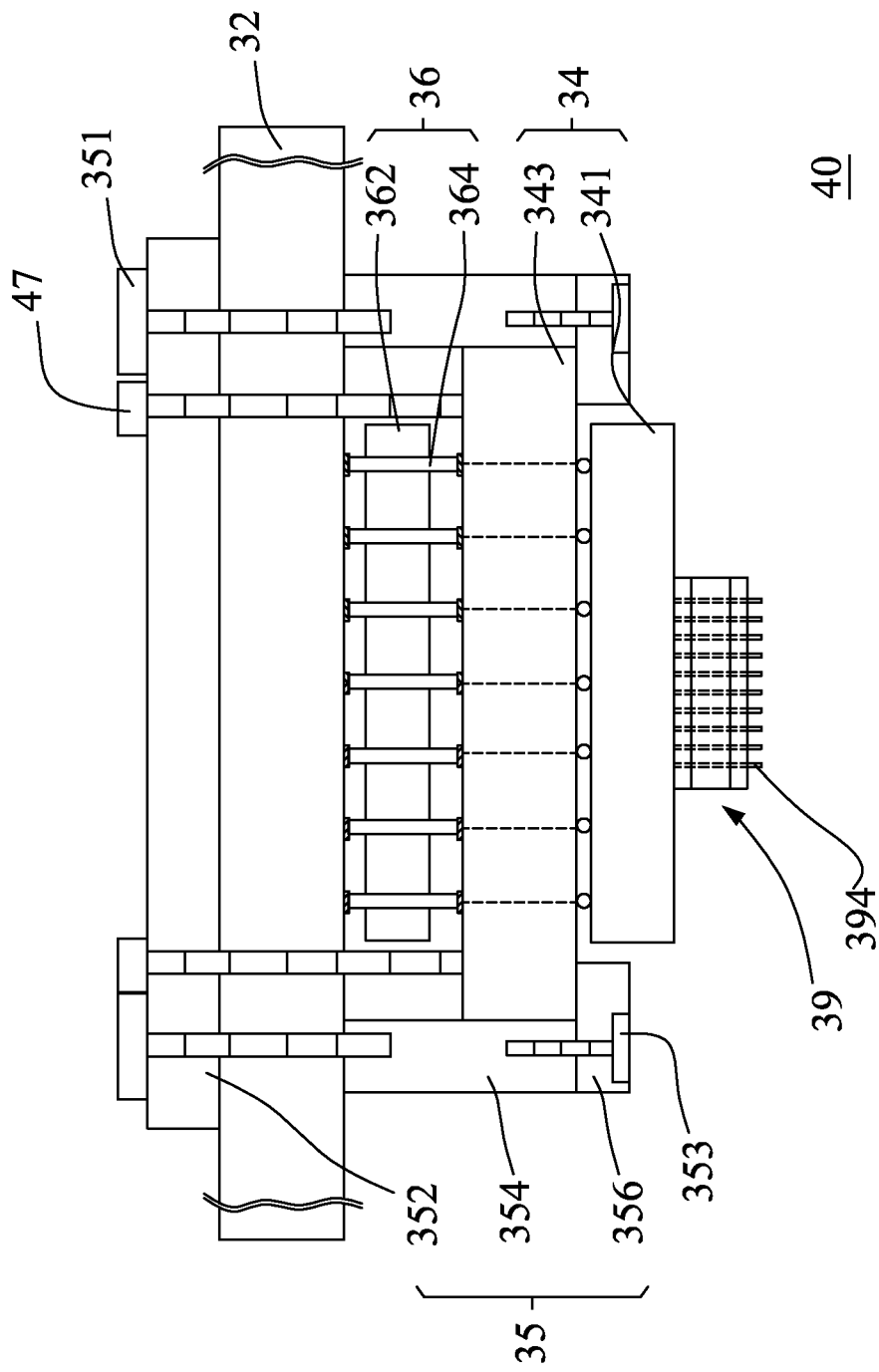
FIG. 6 shows a probing device of a third embodiment in the present invention.

Please refer to FIG. 6 which shows a probing device 40 of a third embodiment in the present invention. The probing device 40 includes two protective screws 47. The protective screws 47 are penetrated through the probe interface board 32, and the bottom ends of the protective screws 47 are pressed on the reinforcing plate 343. The protective screws 47 and the protective spacer 37 have a similar function, i.e. preventing the space transformer 34 from being deflected toward the probe interface board 32, so as to avoid the electrical contacts 364 being compressed and damaged. The assembly method of the probing device 40 is similar to that of the probing device 30, and the difference is that after the fixing frame 35 is mounted on the probe interface board 32, the protective screws 47 are screwed so as to make its end being pressed on the reinforcing plate 343.

Figure 7:
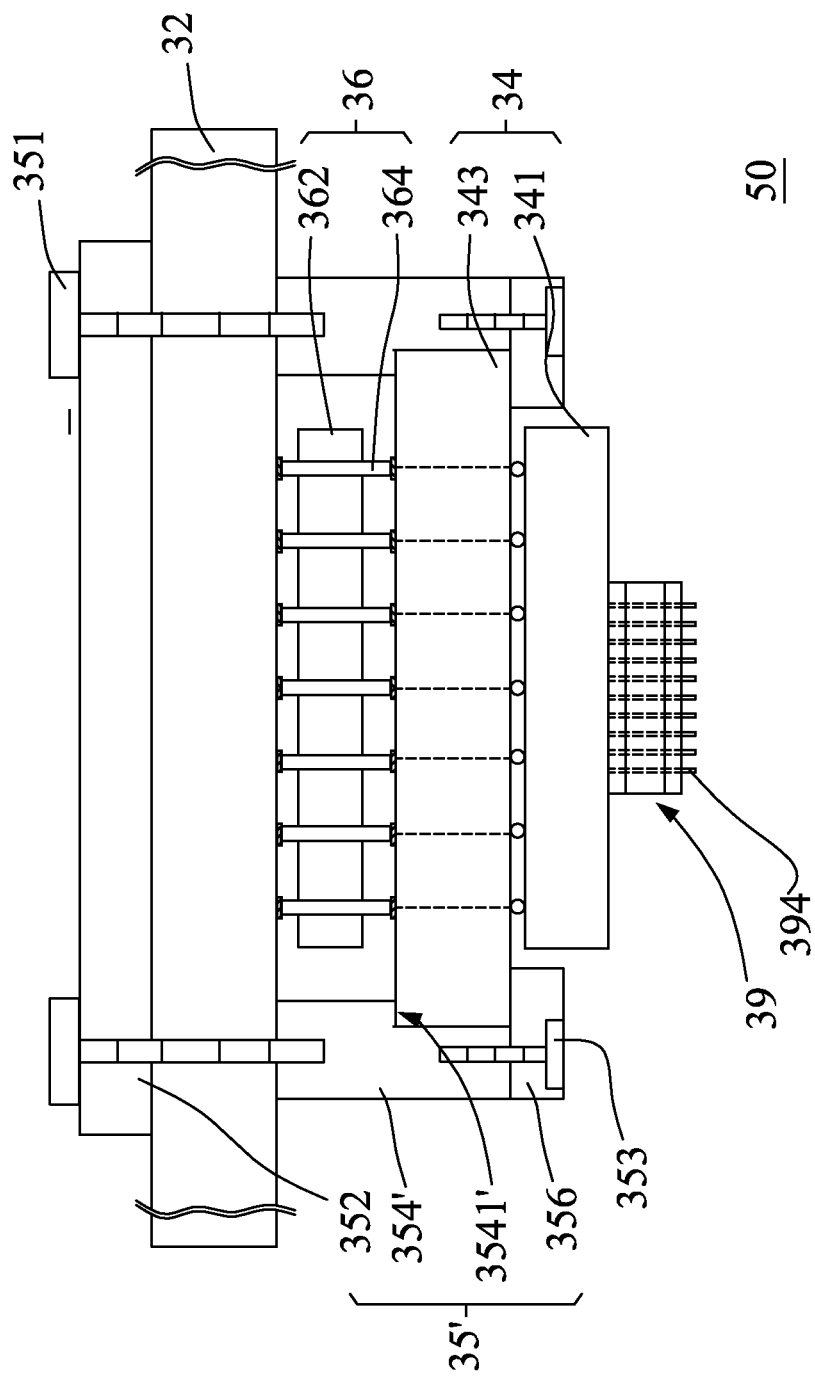
FIG. 7 shows a probing device of a fourth embodiment in the present invention.

Please refer to FIG. 7 which shows a probing device 50 of a fourth embodiment in the present invention. In the probing device 50, a limit portion 3541' is formed on the frame body 354' of the fixing frame 35'. Compared with respect to the holding portion 356, the limit portion 3541' is holding on the other side of the reinforcing plate 343. In other words, the reinforcing plate 343 is clamped by the holding portion 356 and the limit portion 3541'. Because of the limit portion 3541', the deformation of the space transformer 34 caused by the reaction force from the device under test can be avoided. In addition, the limit portion 3541' can prevent the transformer 34 from being deflected toward the probe interface board 32 and protect the electrical contacts 364 from being compressed and damaged, so that the limit portion 3541' can be a protective device for the probing device 50. The assembly method of the probing device 50 is similar to that of the probing device 30, and thus not described hereinafter.

Figure 8A:
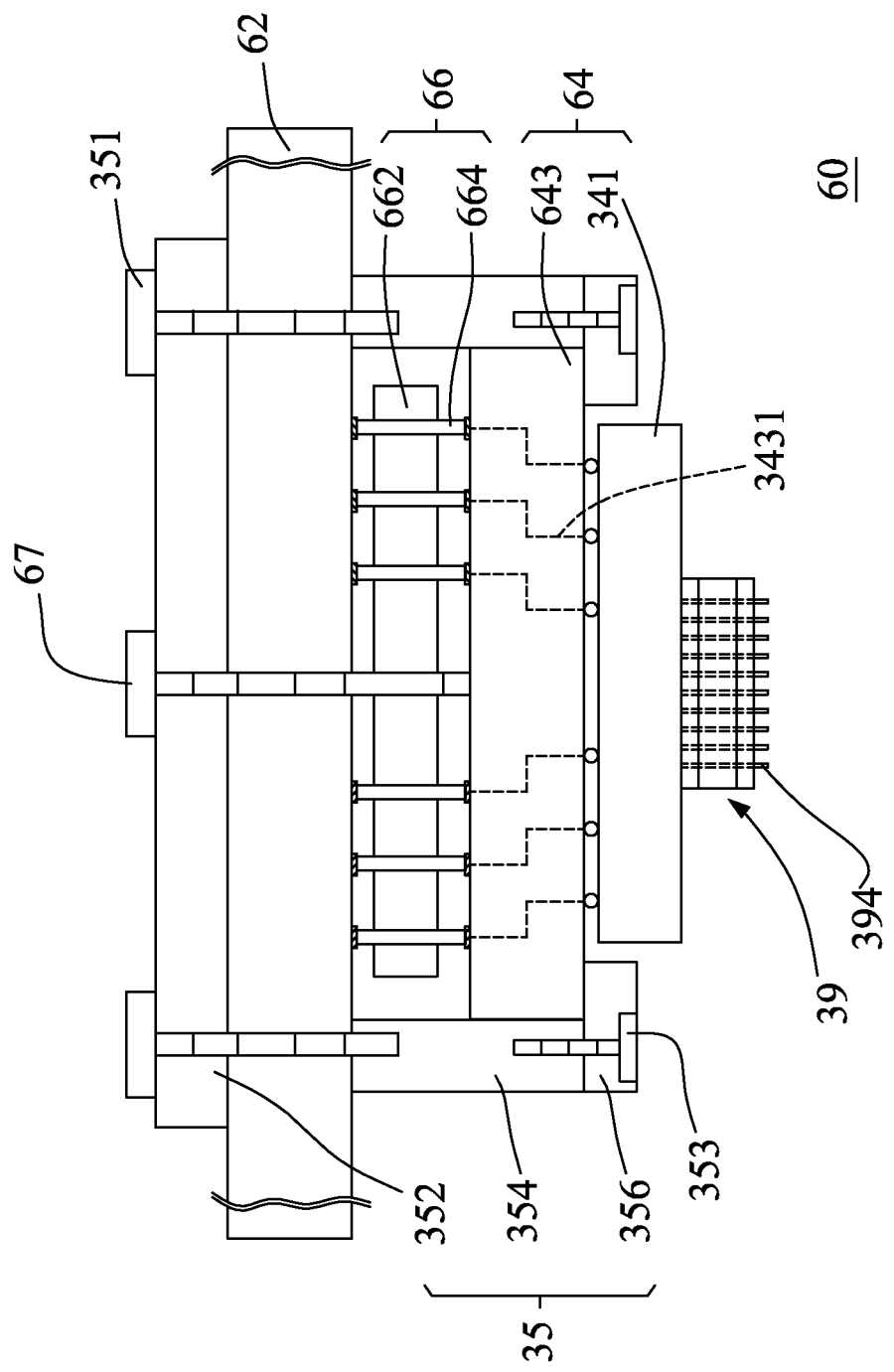
FIG. 8A shows a probing device of a fifth embodiment in the present invention.

Please refer to FIG. 8A which shows a probing device 60 of a fifth embodiment in the present invention. The probing device 60 includes a protective screw 67. The protective screw 67 is penetrated through the center portion of a probe interface board 62 and the center portion of a supporting plate 662 of the conductive elastic member 66. The bottom end of the protective screw 67 is pressed on the reinforcing plate 643. In another embodiment, a threaded hole (not shown) can be formed in the reinforcing plate 643, and the bottom end of the protective screw 67 can be screwed with the threaded hole. If the reinforcing plate 643 is made of ceramic material and not easily to be threaded, a metal block having an inner thread can be embedded in the reinforcing plate 643, so as to lock the bottom end of the protective screw 67 and the reinforcing plate 643 together. When the vertical probe 394 is contacted with the device under test, the device under test will apply a reaction force back. At this time, because the bottom end of the protective screw 67 is pressed on the reinforcing plate 643, the deflection of a space transformer 64 toward the probe interface board 62 can be avoided. The assembly method of the probing device 60 is similar to that of the probing device 30, and the difference is that after the fixing frame 35 is mounted on the probe interface board 62, the protective screws 67 are screwed so as to make its end being pressed on the reinforcing plate 643.

In FIG. 4A, the circuits 3431 is penetrated through the reinforcing plate 343 vertically. However, in the probing device 60 shown in FIG. 8A, the protective screw 67 is penetrated through the central portion of the conductive elastic member 66, so that the electrical contacts 664 would be configured to be disposed in locations toward the respective two sides. Therefore, the circuits 6431 in the reinforcing plate 643 have a deflecting part, in order to ensure adequate electrical connection between the space transformer 64 and the reinforcing plate 643. Furthermore, in order to better protect the electrical contacts 664, other protective devices, such as the protective device shown in FIG. 4A, FIG. 6, and FIG. 7, can be disposed around the conductive elastic member 66 shown in FIG. 8A.

Figure 8B:
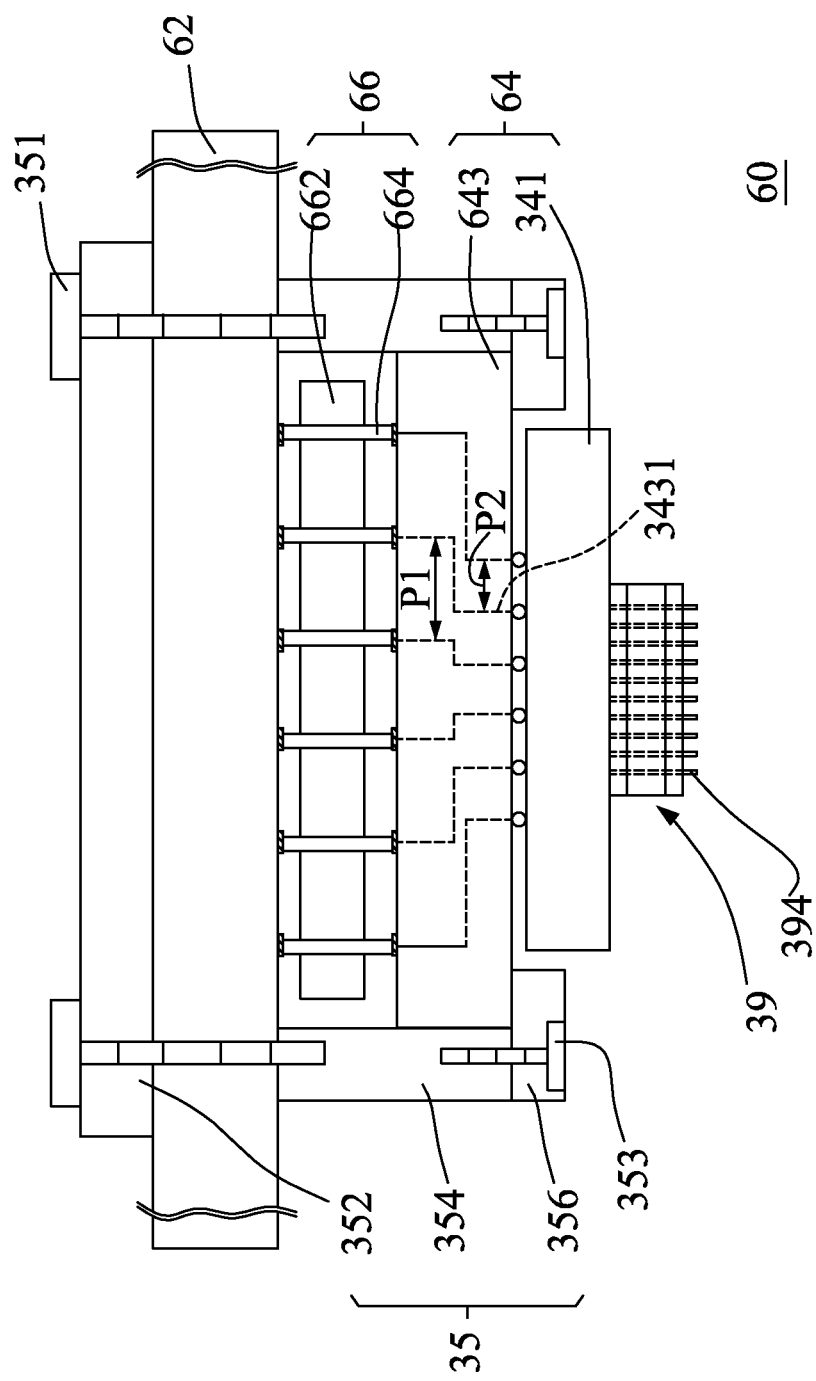
FIG. 8B shows a probing device of variant embodiment compared to FIG. 4A in the present invention.

In FIG. 8B, the protective screw 67 is not disposed and the pitch P1 between the neighboring contact points on the top surface of the reinforcing plate 643 is larger than the pitch P2 between the neighboring contact points on the bottom surface of the reinforcing plate 643.

Figure 9:
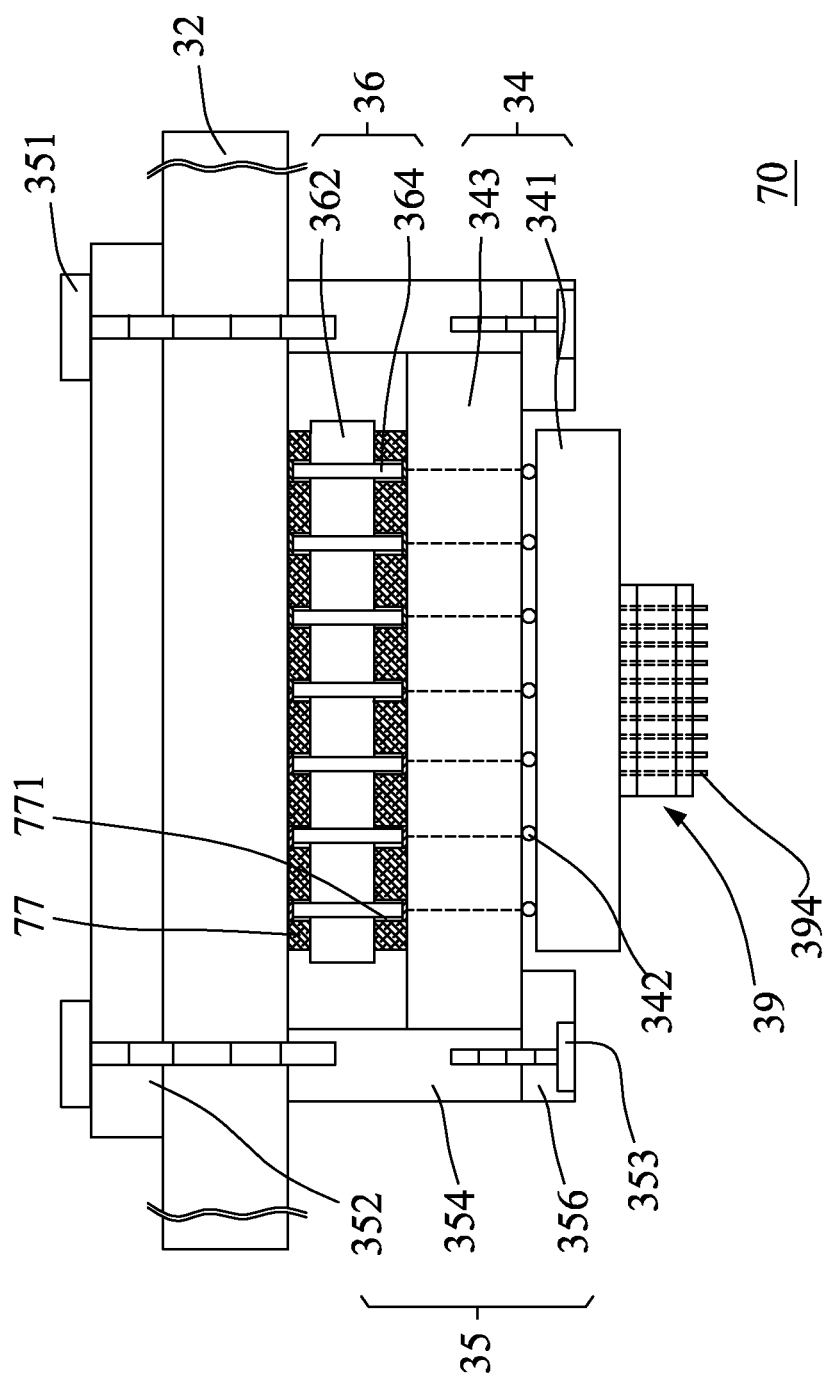
FIG. 9 shows a probing device of a sixth embodiment in the present invention.

Please refer to FIG. 9 which shows a probing device 70 of a sixth embodiment in the present invention. In this embodiment, the protective device of the probing device 70 includes two protective films 77. One of the protective films 77 is disposed between the supporting plate 362 and the reinforcing plate 343, and another protective film 77 is disposed between the supporting plate 362 and the probe interface board 32. The protective film 77 has a plurality of through holes 771 and the electrical contacts 364 are penetrated through the through holes 771. Person of ordinary skill in the art can also choose to dispose only one protective film 77 in the probing device 70, and the protective film 77 is disposed between the supporting plate 362 and the reinforcing plate 343 or between the supporting plate 362 and the probe interface board 32. The assembly method of the probing device 70 is similar to that of the probing device 30, and thus not described hereinafter.

Figure 10:
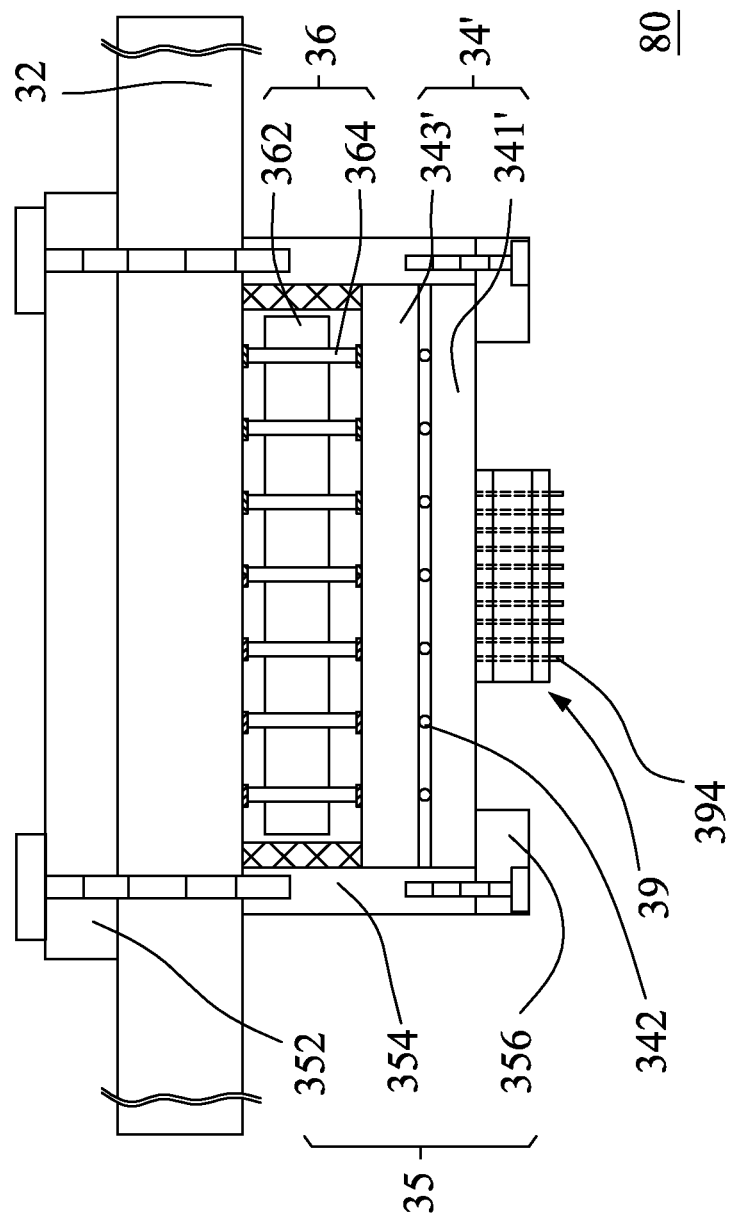
FIG. 10 shows a probing device of a seventh embodiment in the present invention.

In the above described embodiments, the reinforcing plate 343 is disposed in the fixing frame 35, and the space transforming plate 341 is disposed outside of the fixing frame 35. Please refer to FIG. 10, which shows a probing device 80 of a seventh embodiment in the present invention. In the probing device 80, a reinforcing plate 343' of a space transformer 34' and a space transforming plate 341' are both disposed in the frame body 354 of the fixing frame 35. Furthermore, the holding portion 356 of the fixing frame 35 is holding on the space transforming plate 341'.

Figure 11:
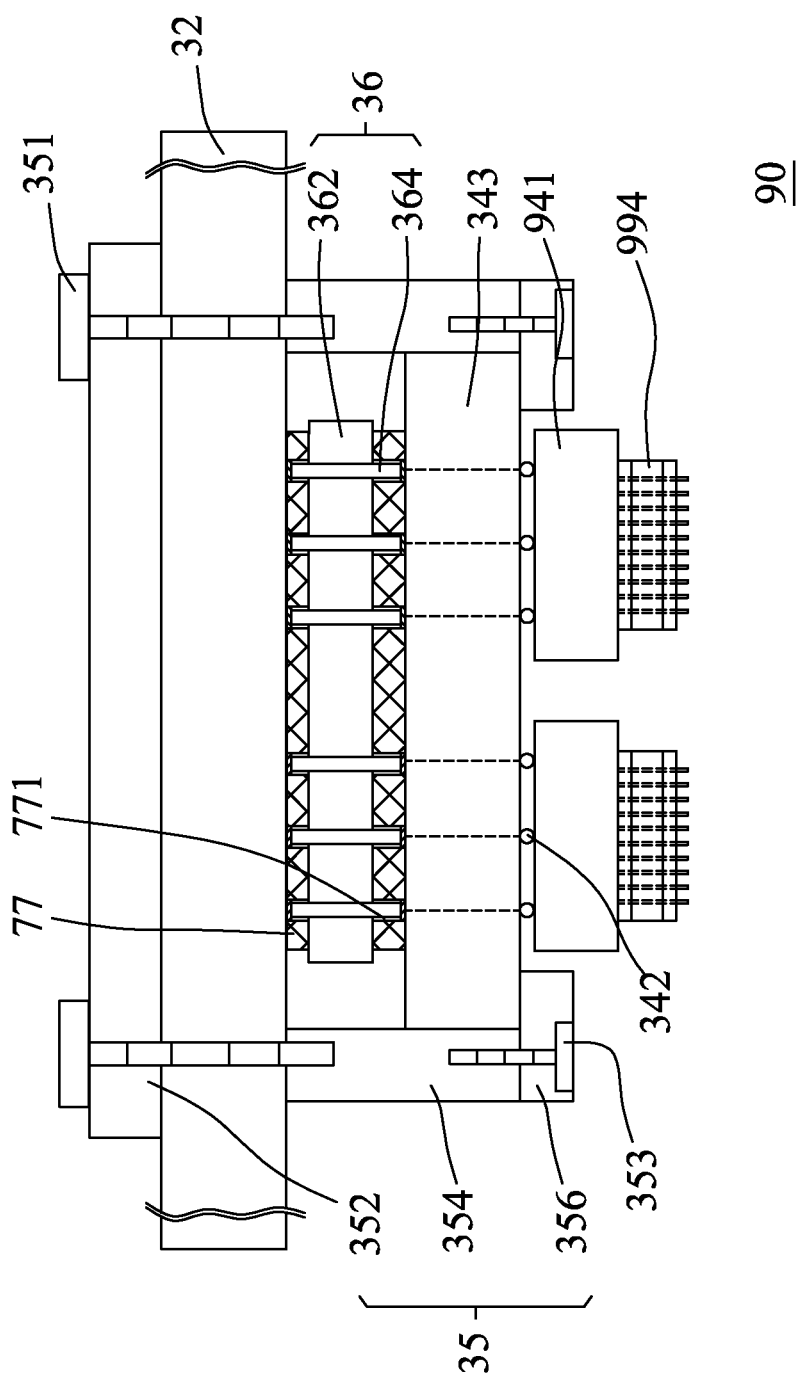
FIG. 11 shows a probing device of an eighth embodiment in the present invention.

Please refer to FIG. 11, which shows a probing device 90 of an eighth embodiment in the present invention. In the probing device 90, two space transforming plates 941 are disposed, and two vertical probe assemblies 994 are each mounted on the bottom ends of the two space transforming plates 941, respectively. Thus the probing device 90 can probe two devices under test at the same time. The surfaces of the probe interface board 32 and the reinforcing plate 343 can be enlarged depending on the requirement conditions, therefore more space transforming plates and vertical probe assemblies can be mounted thereon, so as to probe more than one device under test at the same time. The assembly method of the probing device 90 is similar to that of the probing device 30, and thus not described hereinafter.

Figure 1B:
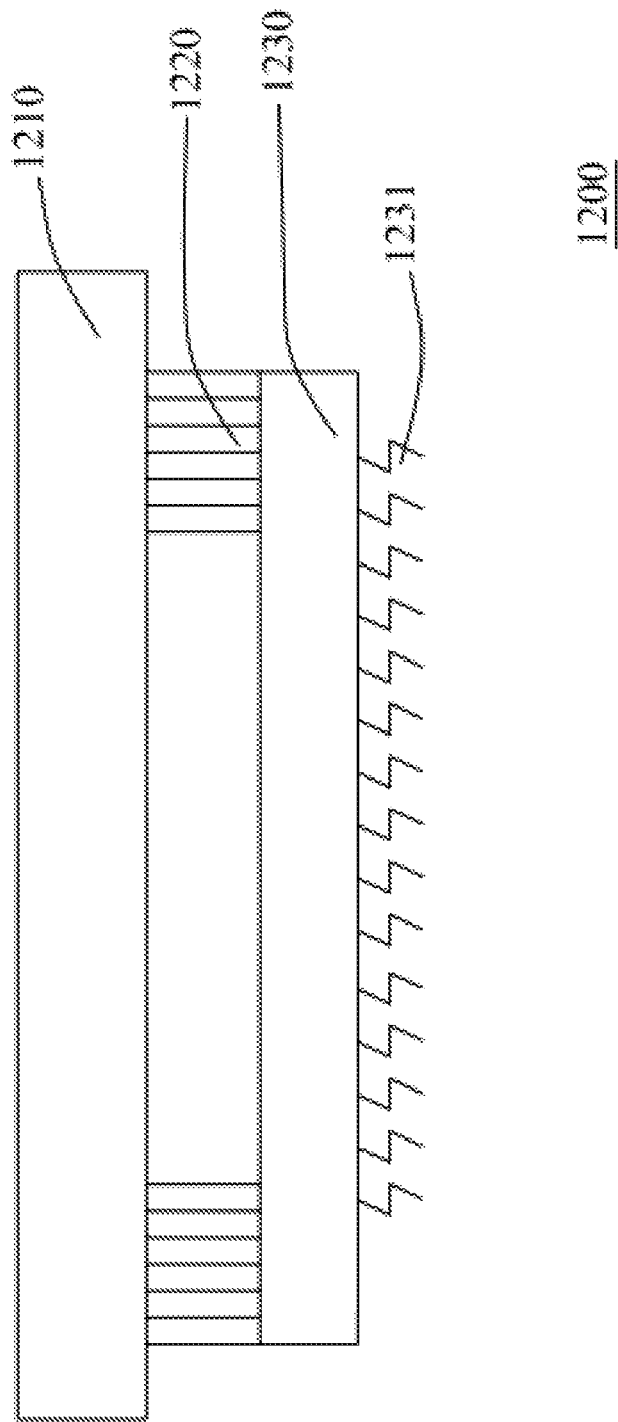
FIG. 1B shows a probing device shown in FIG. 1A.

In all of the embodiments discussed above, the electrical contacts are used to electrically connect the reinforcing plate and the probe interface board, and prevent the probe interface board from being processed under the reflow operation, so as to increase the service life of the probe interface board. The electrical contacts can be designed to be in the form such as the signal contacts shown in FIG. 1 and FIG. 2 of U.S. Pat. No. 6,722,893, the electrical contacts shown in FIG. 3 and FIG. 4 of U.S. Pat. No. 6,846,184, or the elastomeric contacts shown in FIG. 1 and FIG. 2 of U.S. Pat. No. 6,712,620. The electrical contacts can be mainly comprised of the anisotropic conductive paste.

In the above described embodiments, the probing devices are all equipped with the protective devices. However, Person of ordinary skill in the art can opt to design a probing device having no protective device.

Although the description above contains many specifics, these are merely provided to illustrate the invention and should not be construed as limitations of the invention's scope. Thus it will be apparent to those skilled, in the art that various modifications and variations can be made in the system and processes of the present invention without departing from the spirit or scope of the invention.

What is claimed is:

1. An assembly method of direct-docking probing device, comprising the steps of:
providing a space transforming plate which is made by a back-end-of-line semiconductor manufacturing process;
providing a reinforcing plate which has larger mechanical strength than the mechanical strength of the space transforming plate, and a plurality of circuits disposed in the reinforcing plate;
joining and electrically connecting the reinforcing plate and the space transforming plate by reflowing so as to form a space transformer;
providing a conductive elastic member;
providing a probe interface board and mounting the space transformer and the conductive elastic member on the probe interface board, wherein the conductive elastic member is located between and electrically connected with the probe interface board and the reinforcing plate, and the probe interface board is mounted on a test head;
providing at least one vertical probe assembly having a plurality of vertical probes; and
mounting the at least one vertical probe assembly on the space transforming plate, wherein the vertical probes is electrically connected with the space transforming plate;
wherein the thickness of the space transforming plate is smaller than 1.8 mm and predetermined or configured by the client of the probe card manufacturer instead, and the thickness of the reinforcing plate is larger than 1.0 mm;
wherein the conductive elastic member is disposed between the probe interface board and the reinforcing plate, and the conductive elastic member is disposed on the one side of the reinforcing plate, that is away from the space transforming plate;
wherein the reinforcing plate is disposed between the conductive elastic member and the space transforming plate.

2. The assembly method of probing device of claim 1, further comprising the steps of:
providing a fixing frame, and the fixing frame comprising a stiffener, a frame body, and a holding portion;
putting the space transformer and the conductive elastic member in the frame body and the holding portion holding on the space transformer;
mounting the fixing frame containing the space transformer and the conductive elastic member on the probe interface board.

3. The assembly method of probing device of claim 2, further comprising a step of disposing the stiffener on the probe interface board.

4. The assembly method of probing device of claim 2, wherein the holding portion is holding on the reinforcing plate.

5. The assembly method of probing device of claim 2, wherein the holding portion is holding on the space transforming plate.

6. The assembly method of probing device of claim 2, wherein the frame body and the holding portion are formed integrally.

7. The assembly method of probing device of claim 1, wherein the reinforcing plate is a multilayer ceramic structure and the space transforming plate is a multilayer organic structure.

8. The assembly method of probing device of claim 7, wherein the thickness of the reinforcing plate is between 1.0 mm and 3.0 mm.

9. The assembly method of probing device of claim 1, wherein the conductive elastic member comprises a supporting plate and a plurality of electrical contacts, the electrical contacts are penetrated through the supporting plate and fixed by the supporting plate, and the electrical contacts possess elasticity.

10. The assembly method of probing device of claim 1, wherein the circuits in the reinforcing plate are vertically penetrated through the reinforcing plate.

11. The assembly method of probing device of claim 1, wherein the quantity of the space transforming plates and the vertical probe assemblies are both more than one, and each vertical probe assembly is individually electrically connected to one of the space transforming plates, respectively.

12. The assembly method of probing device of claim 1, wherein the reinforcing plate and the space transforming plate are rectangular.

13. The assembly method of probing device of claim 1, wherein the length of the reinforcing plate is 5 mm to 10 mm longer than the length of the space transforming plate.

* * * * *